(12) United States Patent
Chiang et al.

(10) Patent No.: US 8,601,419 B1
(45) Date of Patent: Dec. 3, 2013

(54) ACCURATE PROCESS HOTSPOT DETECTION USING CRITICAL DESIGN RULE EXTRACTION

(71) Applicant: Synopsys, Inc., Mountain View, CA (US)

(72) Inventors: Charles C. Chiang, Saratoga, CA (US); Yen-Ting Yu, New Taipei (TW); Hui-Ru Jiang, New Taipei (TW); Subarnarekha Sinha, Palo Alto, CA (US); Ya-Chung Chan, Miaoli County (TW)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/669,387

(22) Filed: Nov. 5, 2012

(51) Int. Cl.
    *G06F 17/50* (2006.01)
(52) U.S. Cl.
    USPC .......................................... 716/112; 716/113
(58) Field of Classification Search
    USPC .................................................. 716/110–115
    See application file for complete search history.

(56) References Cited

U.S. PATENT DOCUMENTS

| | | | |
|---|---|---|---|
| 7,818,707 B1 | 10/2010 | Gennari et al. | |
| 2006/0036977 A1* | 2/2006 | Cohn et al. | 716/4 |
| 2006/0090146 A1* | 4/2006 | LeBritton et al. | 716/4 |
| 2007/0240086 A1* | 10/2007 | Sinha et al. | 716/4 |
| 2010/0185994 A1 | 7/2010 | Pikus et al. | |

OTHER PUBLICATIONS

Ding et al. "High Performance Lithographic Hotspot Detection using Hierarchically Refined Machine Learning", 16th Asia and South Pacific Design Automation Conference (ASP-DAC), Jan. 25-28, 2011, pp. 775-780.
Ding et al. "Machine Learning based Lithographic Hotspot Detection with Critical-Feature Extraction and Classification", IEEE Conference on IC Design and Technology (ICICDT), May 18-20, 2009, pp. 219-222.
Kahng et al. "Fast Dual Graph Based Hotspot Detection", Photomask Technology 2006, Patrick M. Martin and Robert J. Nader, ed., Proc. of SPIE, vol. 6349, 6349H (2006).
Lin et al. "TCG: A Transitive Closure Graph-Based Representation for Non-Slicing Floorplans", DAC 2001, Las Vegas, Nevada, USA, Jun. 18-22, 2001, pp. 764-769.
Wuu et al. "Rapid Layout Pattern Classification", 16th Asia and South Pacific Design Automation Conference (ASP-DAC), Jan. 25-28, 2011, pp. 781-786.
Xu et al. "Accurate Detection for Process-Hotspots with Vias and Incomplete Specification", IEEE/ACM International Conference on Computer-Aided Design (ICCAD), Nov. 4-8, 2007, pp. 839-846.
Yao et al. "Efficient Process-Hotspot Detection Using Range Pattern Matching", ICCAD, Nov. 5-9, 2006, San Jose, California, USA, pp. 625-632.

\* cited by examiner

*Primary Examiner* — Binh Tat
(74) *Attorney, Agent, or Firm* — Bever, Hoffman & Harms, LLP; Jeanette S. Harms

(57) ABSTRACT

An accurate process hotspot detection technique based on DRC is provided. In this technique, critical DRC rules can be extracted from a pattern. This extraction can include generating horizontal tiles and vertical tiles in the pattern, and adding directed edges to indicate relations between adjacent tiles in the pattern. Rule rectangles, which can also be generated during the critical DRC rule extraction, describe polygon placement in the pattern with a minimal number of critical DRC rules. The extracted DRC rules can be included in a DRC runset file. DRC can be performed with the DRC runset file on a layout. The DRC results can be filtered using the rule rectangles to identify potential hotspots and to verify actual hotspots.

36 Claims, 17 Drawing Sheets

$C_h$ $C_v$

ACCURATE PROCESS HOTSPOT DETECTION USING CRITICAL DESIGN RULE EXTRACTION

BACKGROUND OF THE DISCLOSURE

The disclosure relates to hotspot detection and in particular to an accurate process hotspot detection using critical design rule extraction.

RELATED ART

In designing an integrated circuit (IC), engineers typically rely upon computer simulation tools to help create a circuit schematic design consisting of individual devices coupled together to perform a certain function. To actually fabricate this circuit in a semiconductor substrate, the circuit must be translated into a physical representation, or layout, which itself can then be transferred onto a template (i.e. mask), and then to the silicon surface. Again, computer aided design (CAD) tools assist layout designers in the task of translating the discrete circuit elements into polygons which will embody the devices themselves in the completed IC. These polygons make up the individual components of the circuit, such as gate electrodes, field oxidation regions, diffusion regions, metal interconnections, and so on.

Once the layout of the circuit has been created, the next step to manufacture the IC is to transfer the layout onto a semiconductor substrate. One way to do this is to use the process of optical lithography in which the layout is first transferred onto a physical template which is in turn used to optically project the layout onto a silicon wafer.

In transferring the layout to a physical template, a mask (e.g. a quartz plate coated with chrome) is generally created for each layer of the integrated circuit design. This is done by inputting the data representing the layout design for that layer into a device such as an electron beam machine, which writes the IC layout pattern into the mask material. In less complicated and dense integrated circuits, each mask comprises the geometric shapes (polygons) which represent the desired circuit pattern for its corresponding layer. In more complicated and dense circuits in which the size of the circuit features approach the optical limits of the lithography process, the masks may also comprise optical proximity correction features such as serifs, hammerheads, bias and assist bars which are designed to compensate for proximity effects. In other advanced circuit designs, phase shifting masks may be used to circumvent certain basic optical limitations of the process by enhancing the contrast of the optical lithography process.

These masks are then used to optically project the layout onto a silicon wafer coated with photoresist material. For each layer of the design, a light is shone on the mask corresponding to that layer via a visible light source or an ultraviolet light source. This light passes through the clear regions of the mask, whose image exposes the underlying photoresist layer, and is blocked by the opaque regions of the mask, leaving that underlying portion of the photoresist layer unexposed. The exposed photoresist layer is then developed, typically, through chemical removal of the exposed/non-exposed regions of the photoresist layer. The end result is a semiconductor wafer coated with a photoresist layer exhibiting a desired pattern which defines the geometries, features, lines and shapes of that layer. This process is then repeated for each layer of the design.

Optical proximity correction (OPC) applies systematic changes to geometries of the layout to improve the printability of a wafer pattern. Specifically, as the size of integrated circuit features drops to $0.18\mu$ and below, the features can become smaller than the wavelength of the light used to create such features, thereby creating lithographic distortions when printing the features onto the wafer. These lithographic distortions can represent significant impacts on device performance.

Rule-based OPC can include rules to implement certain changes to the layout, thereby compensating for some lithographic distortions. For example, to compensate for line-end shortening, rule-based OPC may add a hammerhead to a line end. To compensate for corner rounding, rule-based OPC can add (or subtract) serif shapes from outer (or inner) corners. These changes can form features on the wafer that are closer to the original intended layout. Unfortunately, the more complex lithographic effects cannot be efficiently described by simple geometric rules.

In another type of resolution enhancement technique, lithographic simulation can be used to detect areas where lithographic distortions may occur, which are called "hotspots" herein. In model-based OPC, a real pattern transfer can be simulated (i.e. predicted) with a set of mathematical formulas (i.e. models). In this simulation, the edges of a feature (i.e. a polygon) in a layout can be dissected into a plurality of segments, thereby allowing these segments to be individually moved to correct for proximity effects. The placement of the dissection points is determined by the feature shape, size, and/or position relative to other features. Unfortunately, model-based OPC has a high computational cost, which makes it impractical for hotspot detection at early design stages.

Some features in a layout may not be lithographically resolved using rule-based or model-based OPC. In such cases, the foundry may issue a design rule change (DRC) that prohibits such features from being used in a layout.

Even in a post-DRC layout, some layout patterns are still sensitive to the lithographic process. These potentially problematic layout patterns, referred to as "process hotspots" herein, should be replaced with configurations that result in higher yield. Therefore, detecting process hotspots in a layout is of particular importance to enable this correction process.

Current techniques to provide process hotspot detection, also known as pattern matching, have proven inadequate. For example, a dual graph technique is described in "Fast dual graph based hotspot detection" by A. B. Kahng et al., Proc. SPIE, vol. 6349, pp. 628-635, 2006. In this technique, a dual graph, which represents a given layout, can be used to filter out over-weighted edges and polygons according to a user-specified threshold value. Unfortunately, this technique may generate false alarms due to its simplified error model.

A machine-learning hotspot technique is described in "Machine learning based lithographic hotspot detection with critical feature extraction and classification" by D. Ding et al., Proc. ICICDT, pp. 219-222, 2009. In this technique, hotspot features are extracted and used as "kernels" to train an artificial neural network. Unfortunately, this technique suffers from long training time and false alarms.

String-matching-based hotspot detection is described in "Efficient process-hotspot detection using range pattern matching" by H. Yao, Proc. ICCAD, pp. 625-632, 2006, as well as in "Accurate detection for process-hotspots with vias and incomplete specification" by J. Xu et al., Proc. ICCAD, pp. 839-846, 2007. In this technique, worm-like movement is used to investigate all possible windows within a layout. Each window is converted to a layout matrix, and the matrix and pattern are encoded by strings. String matching is then applied to identify hotspots. Although this technique is accurate, the layout matrix conversion is extremely time consuming and therefore commercially non-viable.

A DRC-based hotspot detection technique is described in "Topological pattern matching" by F. G. Pinkus and T. W. Collins, Jr., U.S. Patent Publication 2010/0185994, published on Jul. 22, 2010. In this technique, all lengths of polygon edges and distances between adjacent polygons inside a given pattern are extracted as topological features during DRC. With this extracted information, a search graph is constructed. Using user-defined properties, this search graph is traversed to identify hotspots. To improve on this DRC-based hotspot detection, U.S. Pat. No. 7,818,707, which issued to F. E. Gennari et al. on October 2010, teaches a hash table to store the location and the configuration around each edge/corner in a layout. Match factors between the pattern and layout are computed to determine process hotspots. However, a sophisticated hash function is required to prevent hash collisions, thereby significantly reducing its commercial liability.

Therefore, a need arises for a commercially-viable process hotspot detection technique.

SUMMARY OF THE EMBODIMENTS

In advanced fabrication technology, the sub-wavelength lithography gap causes unwanted layout distortions. Even if a layout passes design rule checking (DRC), it still might contain process hotspots, which are sensitive to the lithographic process. Hence, process hotspot detection has become a crucial issue. To avoid inaccuracy and long running time, an accurate process hotspot detection technique based on DRC is provided.

In this technique, critical DRC rules can be extracted from a pattern. This extraction can include generating horizontal tiles and vertical tiles in the pattern, and adding directed edges to indicate relations between adjacent tiles in the pattern. Rule rectangles, which can also be generated during the critical DRC rule extraction, describe polygon placement in the pattern with a minimal number of critical DRC rules.

The extracted DRC rules can be included in a DRC runset file. DRC can be performed with the DRC runset file on a layout. The DRC results can be filtered using the rule rectangles to identify potential hotspots and to verify actual hotspots.

The critical DRC rule extraction can include generating a plurality of modified transitive closure graphs (MTCGs), wherein each MTCG represents a compact representation of the pattern. Both horizontal tiled and vertical tiled MTCGs for both horizontal and vertical tiling can be used. In one embodiment, generating the plurality of MTCGs can include using a sweep line algorithm.

Describing the polygon placement can advantageously include using 5 or less critical DRC rules. A first critical DRC rule can measure a width and a height of a block tile only when the block tile does not touch a window boundary of the pattern. A second critical DRC rule can determine a distance between two adjacent block tiles by measuring a width and a height of a space tile that does not touch the window boundary of the pattern and is located between two block tiles. A third critical DRC rule can measure a distance between two convex corners formed by block tiles. A fourth critical DRC rule can include identifying a space tile or a block tile having a single edge touching the window boundary. A fifth critical DRC rule can include indentifying a space tile having exactly two edges touching the window boundary. In one embodiment, the fifth critical DRC rule is used only when the first through fourth critical DRC rules cannot be applied to the pattern. In one embodiment, 8 possible orientations for the pattern can be used during the critical DRC rule extraction.

The filtering can include recording a total number of rule rectangles associated with a given location on the layout, and comparing that total number to a number of rule rectangles of the pattern. When the total number is equal to or greater than the number of rule rectangles of the pattern, then a potential hotspot is identified. The filtering can further include performing slice comparisons and/or area comparisons to verify that the potential hotspot is an actual hotspot.

A non-transitory, computer-readable medium storing computer-executable instructions for providing hotspot detection is also described. These instructions, when executed by a processor, cause the processor to execute the above-described process. A system comprising a processor configured to execute this process is also described. The system can further include an output device for generating matched locations indicating verified actual hotspots in the layout.

DETAILED DESCRIPTION OF THE DRAWINGS

Design rules are a set of parameters to guarantee the manufacturability of a layout. For a specific manufacturing process, foundries provide the corresponding set of rules to ensure sufficient margins to compensate for variability during manufacturing. If these rules are violated, the design may not operate correctly.

Figure 1:
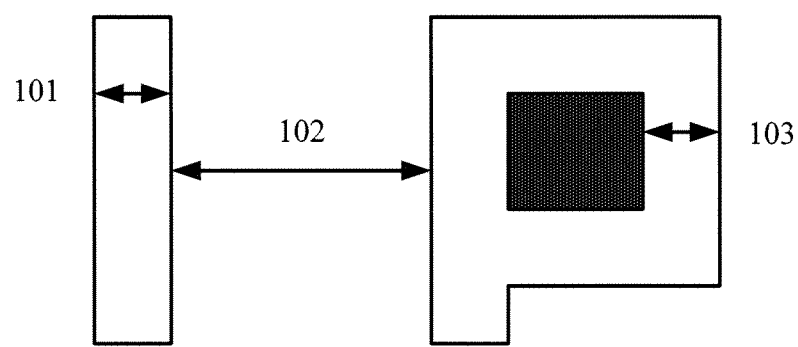
FIG. 1 illustrates three fundamental design rules.

FIG. 1 illustrates three fundamental design rules. For a single layer, a width rule specifies the minimum width 101 of any polygon in the layout, while a spacing rule specifies the minimum distance 102 between two neighboring polygons.

For two layers, an enclosure rule specifies a polygon should be covered with some additional margin 103 by some polygon on the other layer.

In addition to these three fundamental rules, modern DRC tools can perform general dimensional checks within a single polygon (including length, width, area, overlap, ratio, and density calculations) or between polygon edges (including intersecting polygon spacings, enclosure spacings, and external polygon spacings). Given a runset file (i.e. the design rules for a specific process) and a layout, a DRC tool reports design rules. Design rules can be expressed by equations and/or inequalities. For example, the minimum spacing rule can be described as the spacing between any two adjacent polygon edges is smaller than the spacing 102. In its report, the DRC tool indicates the locations where any polygon edges violate the minimum spacing value. In general, the DRC report indicates both locations and violated rules. As used by the DRC industry, a "hotspot pattern" is a pattern with exact dimensions provided by a foundry. A "hotspot location" is a specific location of the layout that a hotspot pattern exactly matches that of the pattern inside the pattern window.

Figure 2:
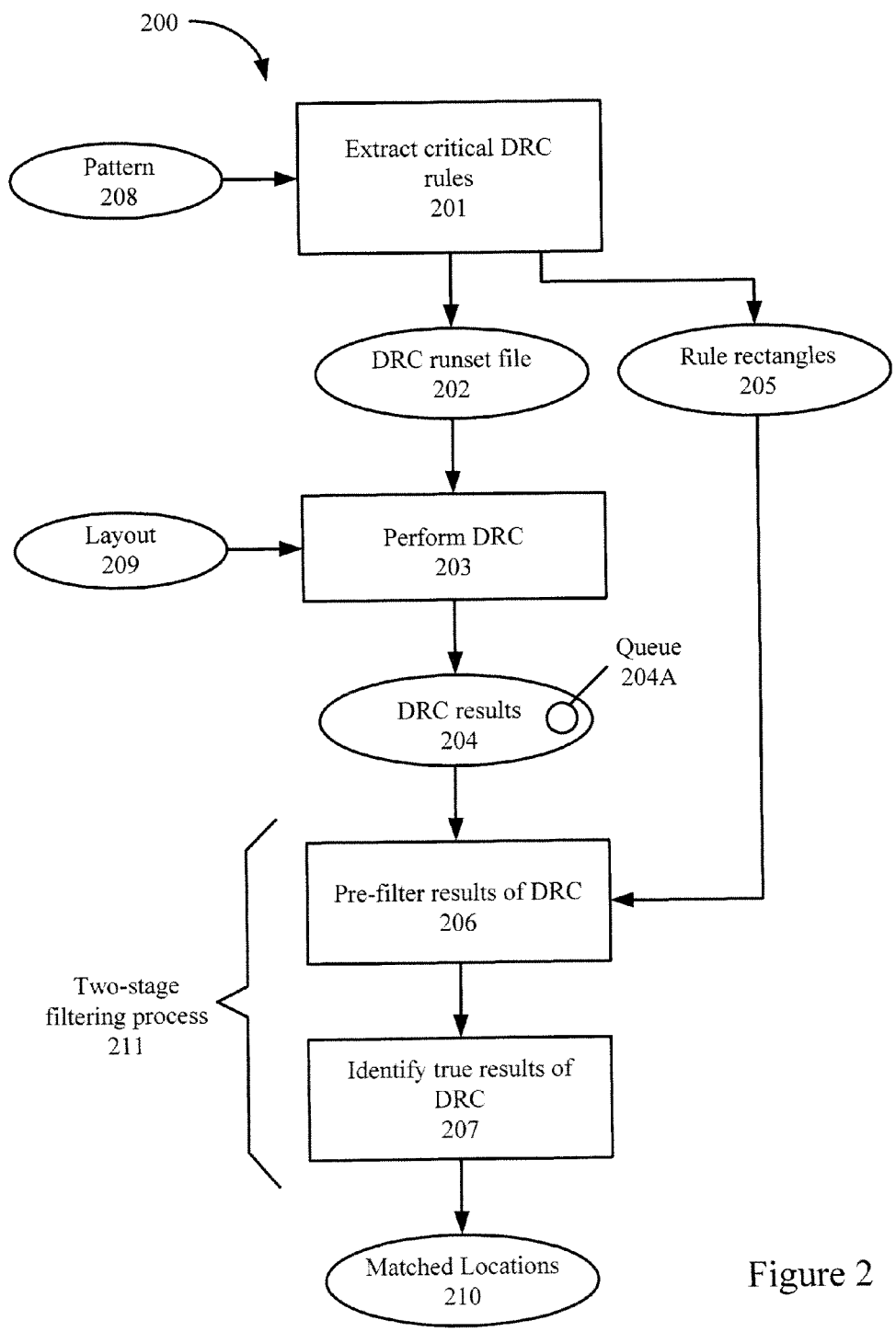
FIG. 2 illustrates an exemplary DRC-based hotspot detection technique.

FIG. 2 illustrates an exemplary DRC-based hotspot detection technique 200. In step 201, critical DRC rules can be extracted from a hotspot pattern 208. Note that conventionally all topological relations of edges within a pattern are interpreted with respect to the design rules. However, doing so may result in thousands of locations reported by DRC, thereby making subsequent analysis difficult. Therefore, in one embodiment, only critical DRC rules are extracted to facilitate DRC and subsequent analysis. In one embodiment, "critical" DRC rules refer to a few predetermined rules (e.g. first through fifth rules, described below) used to capture basic information regarding the size and placement of polygons in a pattern.

In one embodiment, described in further detail below, a modified transitive closure graph (MTCG) can facilitate extracting only the critical topological features of a hotspot pattern and converting them to design rules. The extracted critical DRC rules can be included with the standard process rules in a DRC runset file 202. As described in further detail below, the extracted critical DRC rules allow the DRC to flag layout locations for potential hotspots. In step 203, DRC can be performed on DRC runset file 202 to generate DRC results 204. DRC results (also called a report) 204 include the layout locations of the polygons that fit any generated rule (i.e. both standard process rules and extracted critical design rules). In step 206, DRC results 204 can be pre-filtered to indicate all potential layout locations that match the given pattern. In one embodiment, eight possible orientations of pattern 208 can be considered to ensure completeness. In step 207, all true locations can be identified. Thus, steps 206 and 207 can be characterized as providing a two-stage filtering process 211. The identified true locations can be output as matched locations 210 by the DRC tool.

Step 201 can include 1) modeling the given pattern by a good representation that can reflect topological features, and then 2) selecting the critical features from the representation and translating those critical features to the design rules. To accomplish the modeling, a standard TCG representation (widely used in the industry to represent a compact placement) can be modified. The standard TCG representation uses a pair of constraint graphs, i.e. horizontal constraint graph $C_h$ and vertical constraint graph $C_v$, to record geometric relations among polygons. However, hotspots may not be in a compact form because of spacing between polygons.

Figure 3:
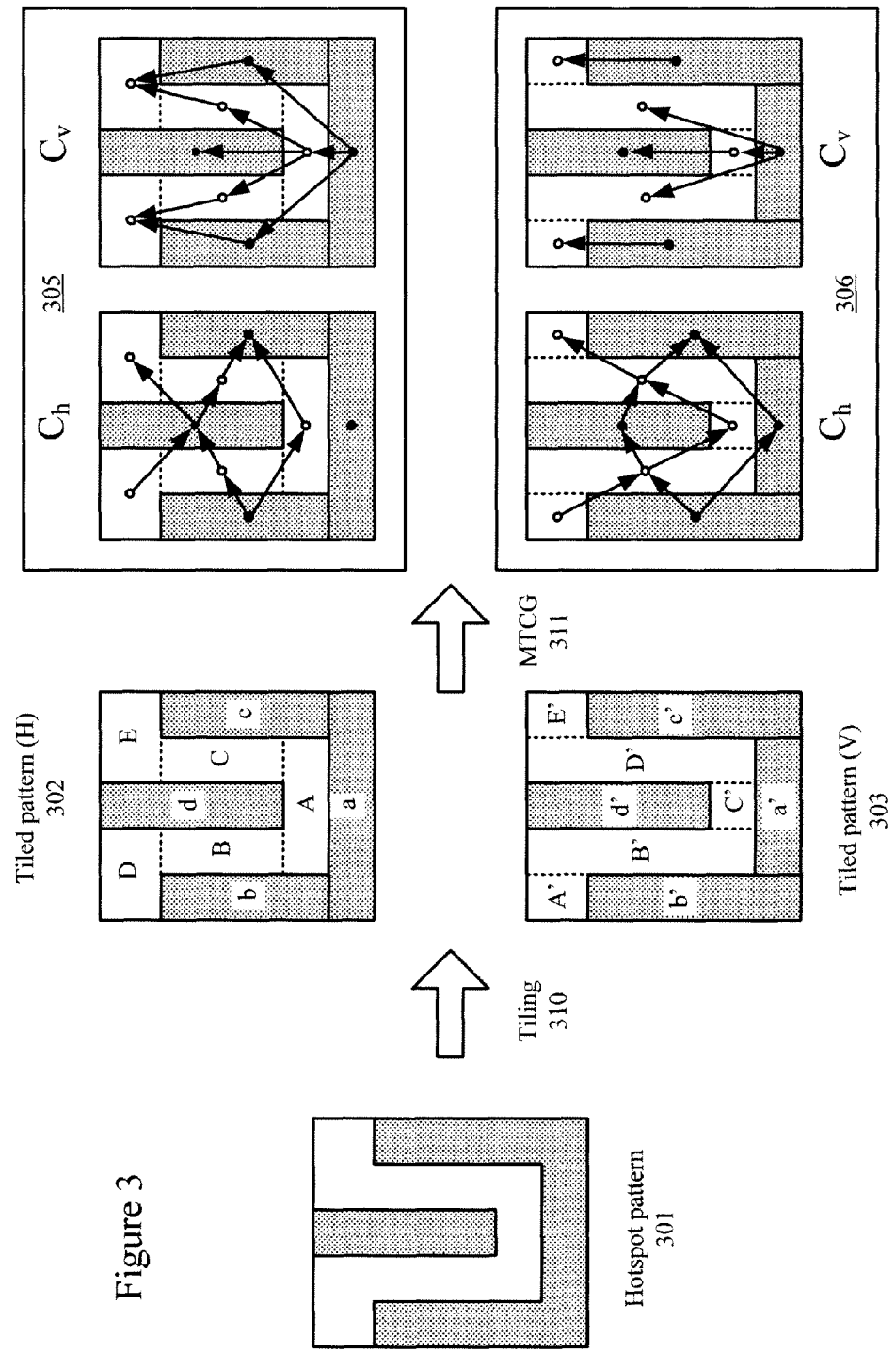
FIG. 3 illustrates an exemplary hotspot pattern that is subjected to a tiling process.

Notably, the spacing between polygons (i.e., white spaces) is important for hotspot detection. In one embodiment, to consider white spaces as topological features of a pattern, the pattern can be tiled. This tiling can be performed for both the $C_h$ and $C_v$ constraint graphs. For example, FIG. 3 illustrates an exemplary hotspot pattern 301 that is subjected to a tiling process 310. Tiling process can generate two tiled patterns, a horizontal tiled pattern 302 and a vertical tiled pattern 303. As shown in FIG. 3, the tiling of hotspot pattern 301 to generate horizontal tiled pattern 302 stretches the horizontal edges of each polygon until those edges reach other polygons or the window boundary. After horizontal tiling, pattern 301 is composed of block tiles a, b, c, d (contributed by polygons) and space tiles A, B, C, D, E (contributed by white spaces). Similarly, the tiling of the pattern to generate vertical tiled pattern 303 stretches the vertical edges of each polygon until those edges reach other polygons or the window boundary. After vertical tiling, pattern 301 is composed of block tiles a', b', c', d' (contributed by polygons) and space tiles A', B', C', D', E' (contributed by white spaces). In this manner, hotspot pattern 301 can be transformed into two compact representations.

It is known that each compact placement can be represented by a unique TCG. Advantageously, a MTCG can represent a unique tiled pattern. In FIG. 3, horizontal tiled pattern 302 and vertical tiled pattern 303 can be subjected to an MTCG process 311 to generate first MTCGs 305 and second MTCGs 306, wherein each of MTCGs 305 and 306 have $C_h$ and $C_v$ constraint graphs. In an MTCG, each vertex represents a block tile (dot) or a space tile (circle), while each edge represents some topological relation among tiles. In a preferred embodiment, the vertex is placed in the middle of the tile.

In one embodiment, MTCGs can be constructed by a sweep line algorithm, which is shown in FIG. 3 using "directed" edges. For example, in the vertical constraint graph $C_v$, a directed edge, which identifies adjacent downstream tiles based on the direction of the sweep line algorithm (shown as an arrow in the constraint graphs of FIG. 3), is added between any two adjacent tiles if their projections on the x-axis overlap. Similarly, in the horizontal constraint graph $C_h$, a directed edge is added between any two adjacent tiles if their projections on y-axis overlap. As shown in FIG. 3, the sweep line algorithm begins with the tiles on one window edge and end on the opposite window edge. A tile that extends from one window edge to the opposite window edge does not have any directed edges (e.g. see constraint graph $C_h$ in MTCGs 305). Because vertical constraint graph $C_v$ and horizontal constraint graph $C_h$ have directional edges, they are MTCGs.

Figure 4A:
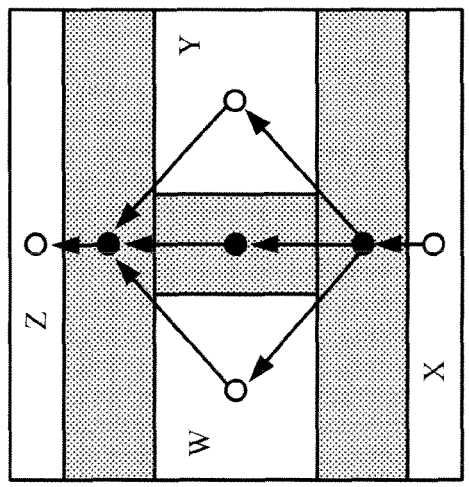
FIGS. 4A and 4B illustrate how horizontal tiled MTCGs and vertical tiled MTCGs provide different information that, in combination, result in a full representation of a hotspot pattern.
Figure 4B:
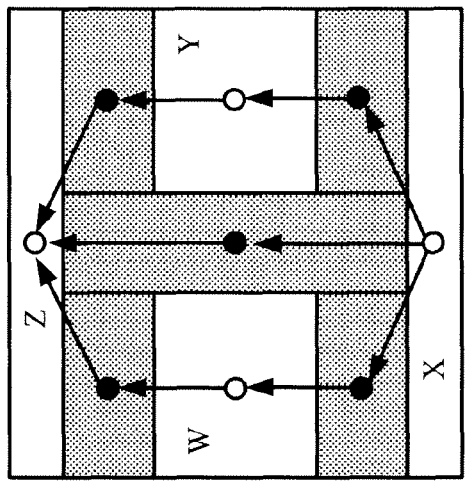

To fully represent a given hotspot pattern, both a horizontal tiled MTCG (wherein the "horizontal" designation refers to horizontal tiling) and a vertical tiled MTCG (wherein the "vertical" designation refers to vertical tiling) should be generated for a constraint graph $C_v$ and a constraint graph $C_h$. For example, referring to FIGS. 4A and 4B, if only horizontal tiled MTCG 401 is used, then the vertical distance between space tiles X and Z cannot be extracted directly. However, vertical tiled MTCG 402 can provide the vertical distance between space tiles X and Z.

As shown above, a MTCG is compact for a given tiled pattern. Moreover, a MTCG is unique for a given tiled pattern and provides a complete (dense) set of graphs to record all topological relations. Notably, because redundant relations are not included, a MTCG is sparse.

Because MTCGs are good representations, they facilitate the second task, i.e. critical feature selection. Note that critical features may be isolated polygons or surrounded by arbitrarily-shaped polygons. Both conditions can be addressed as described in detail below.

Figure 5A:
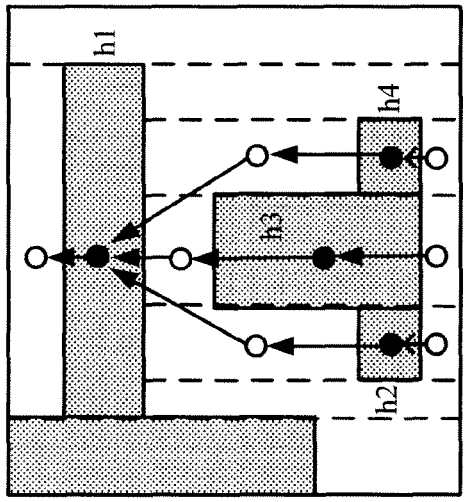
FIGS. 5A and 5B illustrate a first critical DRC rule.
Figure 5B:
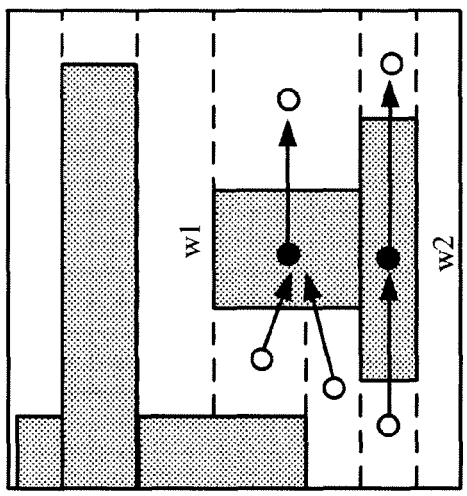

In one embodiment, three basic rules can be used to focus on simple internal topological relations. In a first critical DRC rule, the width and height of a block tile can be determined. As shown in FIGS. 5A and 5B, the dimension of each block tile not touching a window boundary can be determined using constraint graph $C_v$ in a vertical tiled MTCG 501 (FIG. 5A) and constraint graph $C_h$ in a horizontal tiled MTCG 502 (FIG. 5B). FIG. 5A (a constraint graph $C_v$ in a vertical tiled MTCG) facilitates determining heights h1, h2, h3, and h4, whereas FIG. 5B (a constraint graph $C_h$ in a horizontal tiled MTCG) facilitates determining widths w1 and w2. To exclude block tiles touching the window boundary, given an MTCG, only block vertices whose incoming and outgoing edges are connected to space vertices are extracted.

Figure 6A:
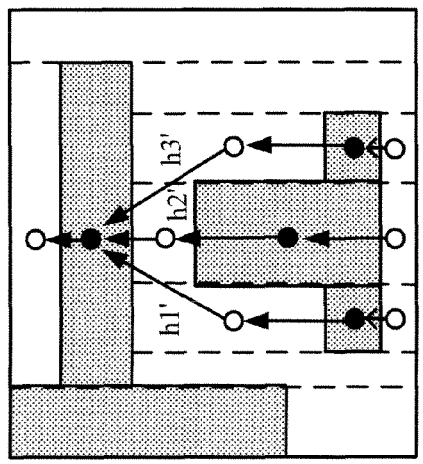
FIGS. 6A and 6B illustrate a second critical DRC rule.
Figure 6B:
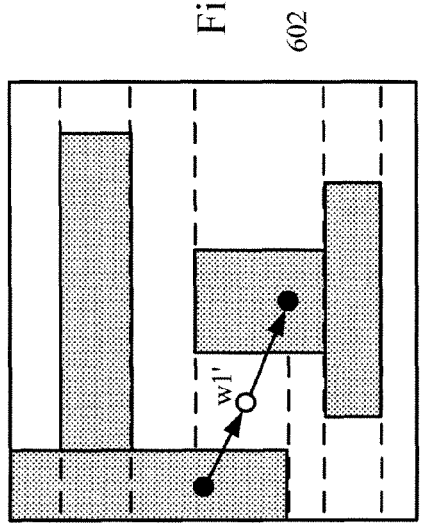

In a second critical DRC rule, the distances between two adjacent block tiles can be determined. As shown in FIGS. 6A and 6B, the dimensions of the space tiles not touching the window boundary and located in between block tiles can be determined using a constraint graph $C_v$ in a vertical tiled MTCG 601 (FIG. 6A) and a constraint graph $C_h$ in a horizontal tiled MTCG 602 (FIG. 6B). FIG. 6A (a constraint graph $C_v$ in a vertical tiled MTCG) facilitates determining heights h1', h2', and h3', whereas FIG. 6B (a constraint graph $C_h$ in a horizontal tiled MTCG) facilitates determining width w1'. Given an MTCG, any space vertex which lies in between exactly two block vertices can be extracted.

Figure 7A:
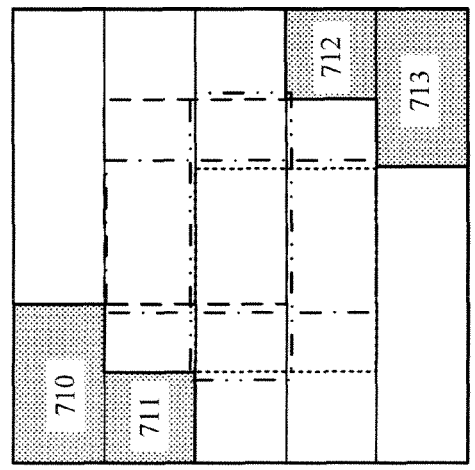
FIGS. 7A-7H illustrate a third critical DRC rule.
Figure 7B:
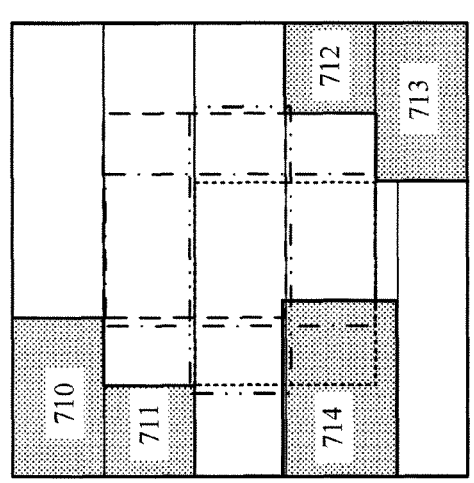

In a third critical DRC rule, the diagonal relations between two convex corners of block (space) tiles can be determined. Convex corners of tiles can be identified by using four rectangles to connect corners of the tiles, wherein no overlapping tiles (of the same type of tile) impinge on the four rectangles. For example, as shown in FIG. 7A, four rectangles connect the corners of block tiles 710, 711, 712, and 713. Specifically, a first rectangle shown by a dashed line connects block tiles 710 and 712; a second rectangle shown by a dashed-dot line connects block tiles 710 and 713; a third rectangle shown by a dotted line connects block tiles 711 and 713; and a fourth rectangle shown by a dashed-double dot connects block tiles 711 and 712. Because no block tile impinges on the four rectangles, block tiles 710, 711, 712, and 713 can be characterized as convex corners. In contrast, FIG. 7B illustrates substantially the same polygons with the addition of block tile 714. Because block tile 714 impinges at least one of the four rectangles, block tiles 710, 711, 712, and 713 are not characterized as convex corners. Thus, the third critical DRC rule can be applied to FIG. 7A, but not FIG. 7B.

Figure 7C:
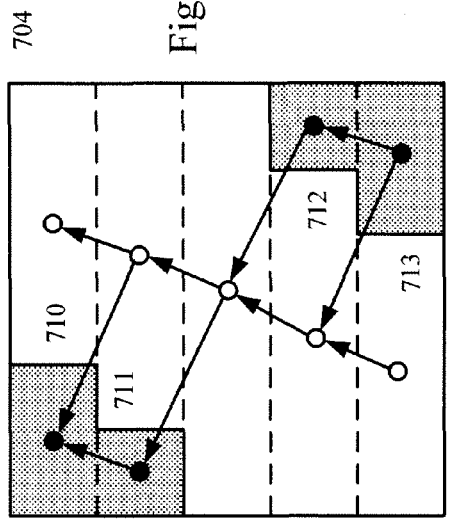
Figure 7E:
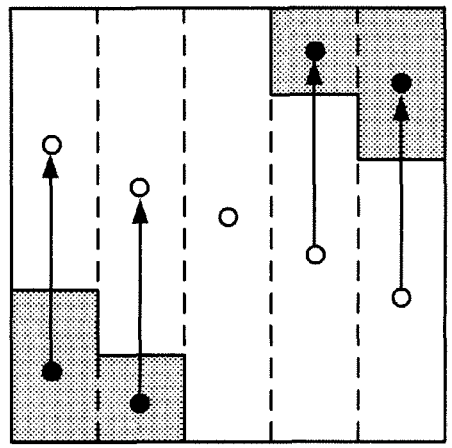
Figure 7D:
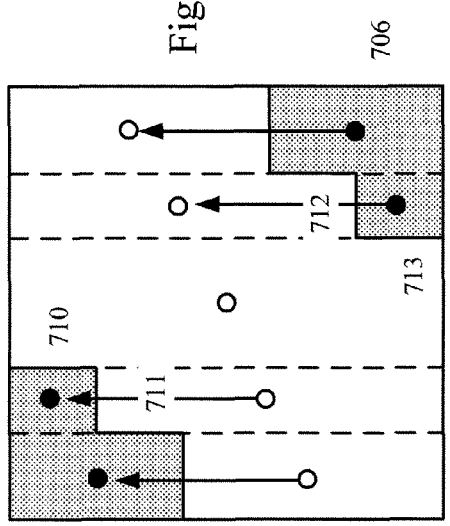
Figure 7F:
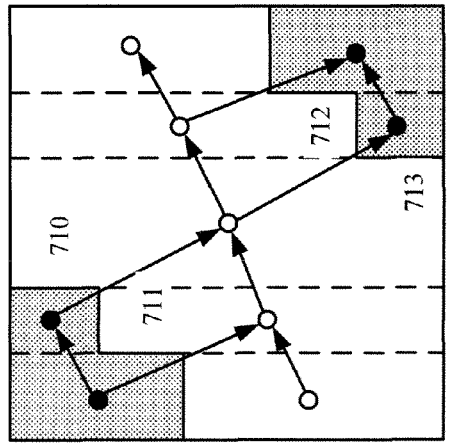

FIGS. 7C and 7D illustrate constraint graph $C_h$ 703 and constraint graph $C_v$ 704 for a horizontal tile MTCG, respectively. FIGS. 7E and 7F illustrate constraint graph $C_h$ 705 and constraint graph $C_v$ 706 for a vertical tile MTCG, respectively. In one embodiment, only in horizontal tiled horizontal constraint graph $C_h$ 704, a diagonal directed edge is added between any two adjacent block tiles (space tiles) if their projections on the y-axis do not overlap, wherein adjacency means there are no other block tiles (space tiles) in between the corner region formed by these two block tiles (space tiles).

In one embodiment, when convex corners are identified, four diagonal edges can be extracted. For example, referring to FIG. 7G, the four diagonal edges include: a first diagonal edge between block tiles 710 and 712, a second diagonal edge between block tiles 710 and 713, a third diagonal edge between block tiles 711 and 712, and a fourth diagonal edge between block tiles 711 and 713. Note that FIG. 7E (vertical tiled MTCG 705) facilitates determining the length of the diagonal edge between block tiles 710 and 713, whereas FIG. 7D (horizontal tiled MTCG 704) facilitates determining the length of the diagonal edge between block tiles 711 and 712.

The other two diagonal edges between the two convex corners can be imputed by using these lengths.

Figure 7H:
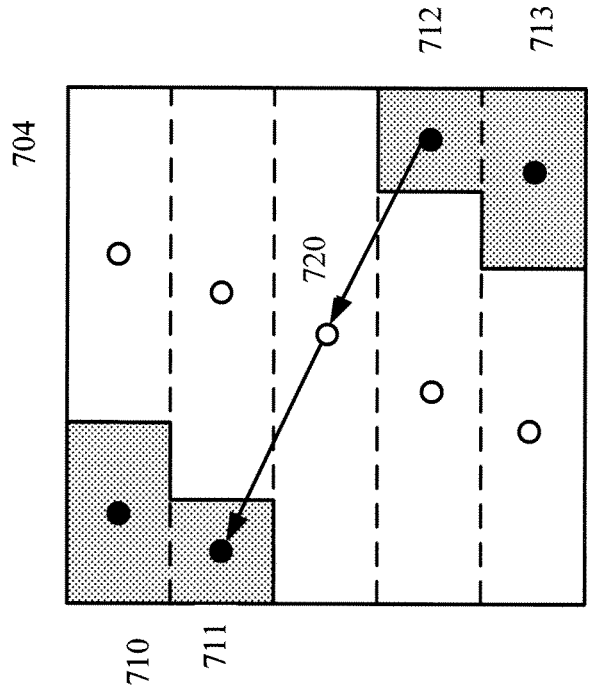
Figure 7G:
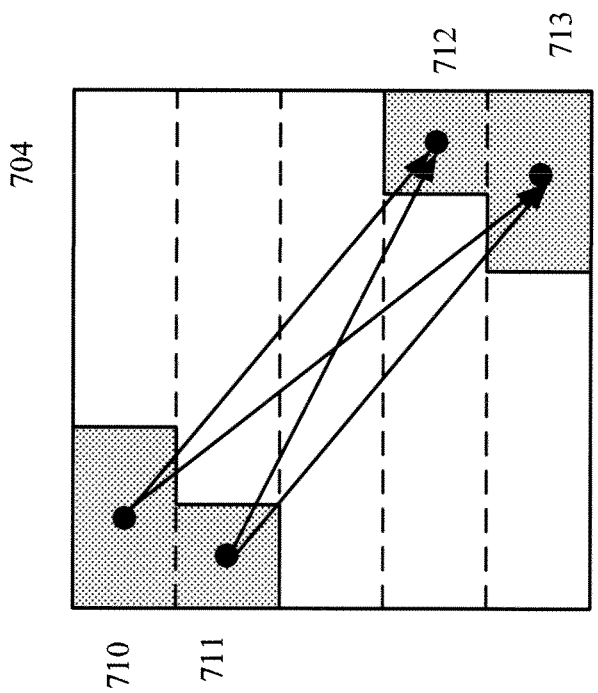

In another embodiment, a reduced diagonal relation among block tiles (space tiles) can be extracted when a space (block) vertex from $C_v$ or $C_h$ with one incoming directed edge and one outgoing directed edge are connected to the same pair of block (space) vertices as a diagonal edge in horizontal tiled constraint graph $C_h$ of a given MTCG. Thus, for example using horizontal tiled constraint graph $C_h$ 704, FIG. 7H shows the incoming and outgoing directed edges for a space vertex 720 between block tiles 711 and 712. Therefore, in this case, only the diagonal edge between block tiles 711 and 712 is extracted.

Figure 7I:
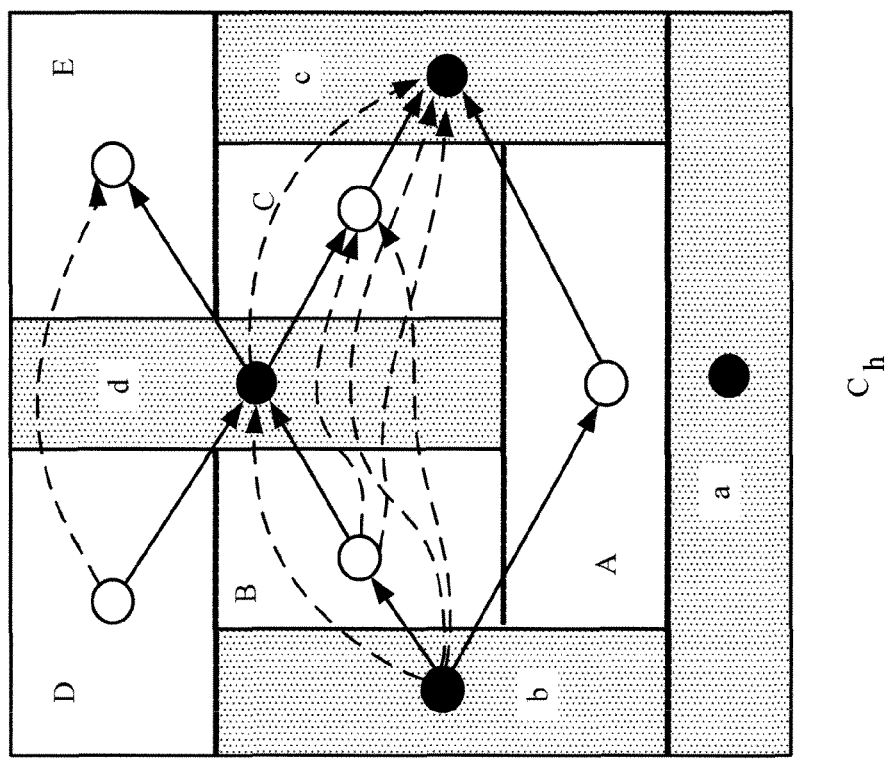
FIG. 7I illustrates a horizontal tiled constraint graph $C_h$ with both directed edges and transitive edges.

Because white spaces are considered, thereby making the tiled patterns compact, the transitive edges (i.e. redundant edges) can be simplified during MTCG construction. FIG. 7I illustrates a horizontal tiled constraint graph $C_h$ with both directed edges (shown as solid lines with arrows) and transitive edges (shown as dashed lines with arrows). As indicated above, any tile projection overlapping with an adjacent tile in the y-axis generates a directed edge. Picking tile b as an example, the edge between tile b and tile d is said to be a transitive edge if there exists another path from tile b to tile d (e.g. path b→B→d). The edge between tile b to tile C is said to be a transitive edge if there exists another path from tile b to tile C (e.g. path b→B→d→C). The edge between tile b to tile c is said to be a transitive edge if there exists another path from tile b to tile c (e.g. path b→B→d→C→c or path b→A→c). Therefore, three transitive edges start from block tile b: b→c, b→d, and b→C. The total transitive edge list for FIG. 7I includes: b→c, b→d, d→C, d→c, B→c, B→C, and D→E. Without these transitive edges, MTCGs can be characterized as sparse representations.

Figure 8B:
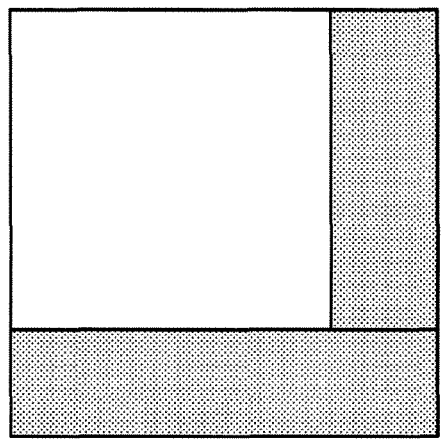
FIGS. 8A, 8B, 8C, and 8D illustrate typical problem patterns.
Figure 8D:
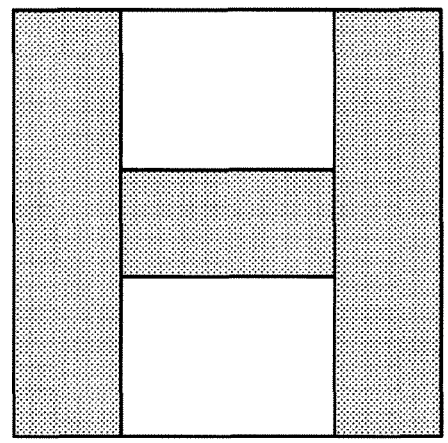
Figure 8A:
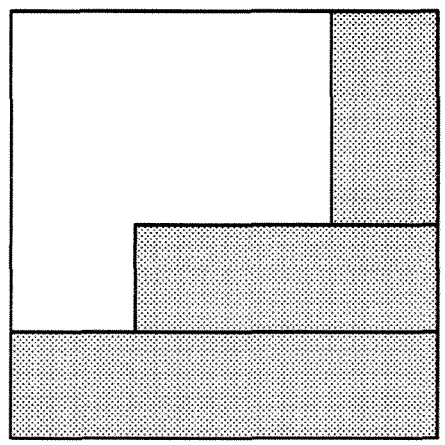
Figure 8C:
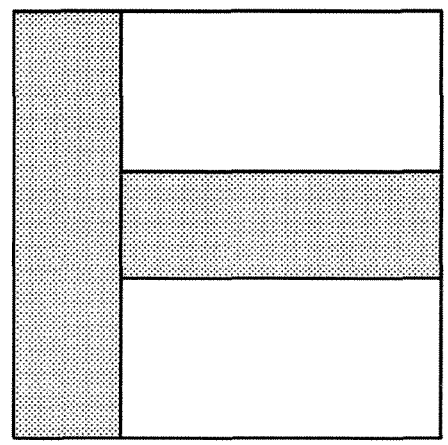

The primary rules, i.e. the first, second, and third critical DRC rules, can handle most hotspot patterns. However, the primary rules may be insufficient for some special cases. For example, the above-described primary rules do not apply to the following patterns: "stairs" (FIG. 8A), "L" (FIG. 8B), and "T" (FIG. 8C). Only one rule, i.e. the first rule, can be applied to a pattern "I" (FIG. 8D). Too few rules imply that too many redundant locations could be reported.

Figure 9B:
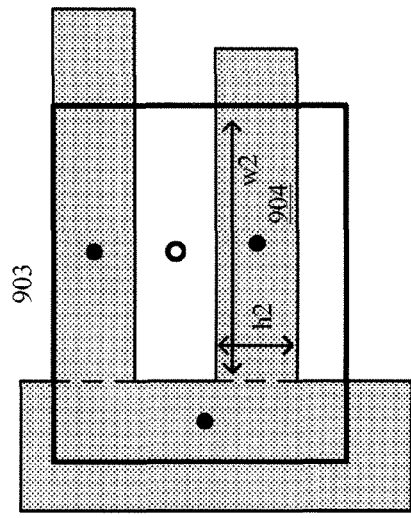
FIGS. 9A and 9B illustrate a fourth critical DRC rule.
Figure 9A:
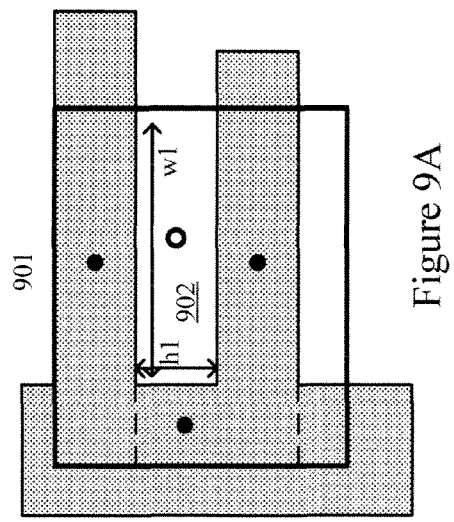

To overcome this difficulty, two secondary rules, described below as the fourth and fifth critical DRC rules, can be added for tiles that touch the window boundary. In the fourth critical DRC rule, the space or block tile with one edge touching the window boundary can be identified and its dimensions determined (called a first boundary tile). Note that this "touching" includes an edge of the polygon ending at or crossing the window boundary. For example, FIG. 9A shows a horizontal tiled MTCG 901 (directional edges not shown) that identifies a space tile 902, then determines its height h1 and width w1. FIG. 9B shows a vertical tiled MTCG 903 (directional edges not shown) that identifies a block tile 904, then determines its height h2 and width w2. Thus, given an MTCG, the dimensions of a tile having a space vertex with zero in-degree or out-degree in constraint graph $C_v$ and non-zero incoming and outgoing edges connected to block vertices in a corresponding constraint graph $C_h$ can be extracted. Similarly, the dimensions of a tile having a space vertex with zero in-degree or out-degree in constraint graph $C_h$ and non-zero incoming and outgoing edges connected to block vertices in a corresponding constraint graph $C_v$ can be extracted. The dimensions of a tile having a block vertex can be similarly determined.

Figure 10B:
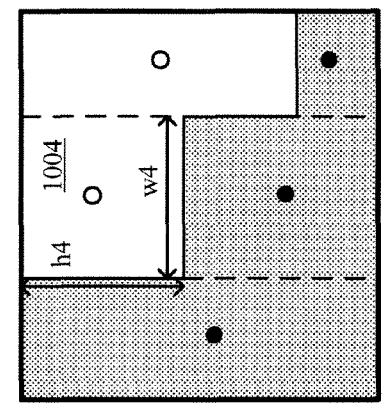
FIGS. 10A and 10B illustrate a fifth critical DRC rule.
Figure 10A:
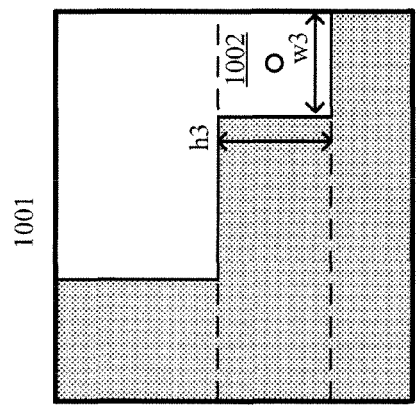

In the fifth critical DRC rule, a space tile with one edge touching the window boundary and another edge touching another space tile (a called second boundary tiles) can be identified and its dimensions determined. For example, FIG. 10A shows a horizontal tiled MTCG 1001 (directional edges not shown) that identifies a space block 1002, then determines its height h3 and width w3. FIG. 10B shows a vertical tiled MTCG 1003 (directional edges not shown) that identifies a space block 1004, then determines its height h4 and width w4. In this manner, the dimensions of the second boundary tiles can be extracted.

The secondary rules (i.e. the fourth and fifth critical DRC rules) can handle the cases that the primary rules cannot, e.g. the fourth critical DRC rule can handle "T" and "I", while the fifth critical DRC rule can handle "stairs" and "L". In one embodiment, because the fifth critical DRC rule is very general, thereby inducing many design rules, if the dimensions of the tiles can be extracted using first through fourth critical DRC rules, then the fifth critical DRC rule is not applied to the MTCGs to ensure fast processing.

Figure 11:
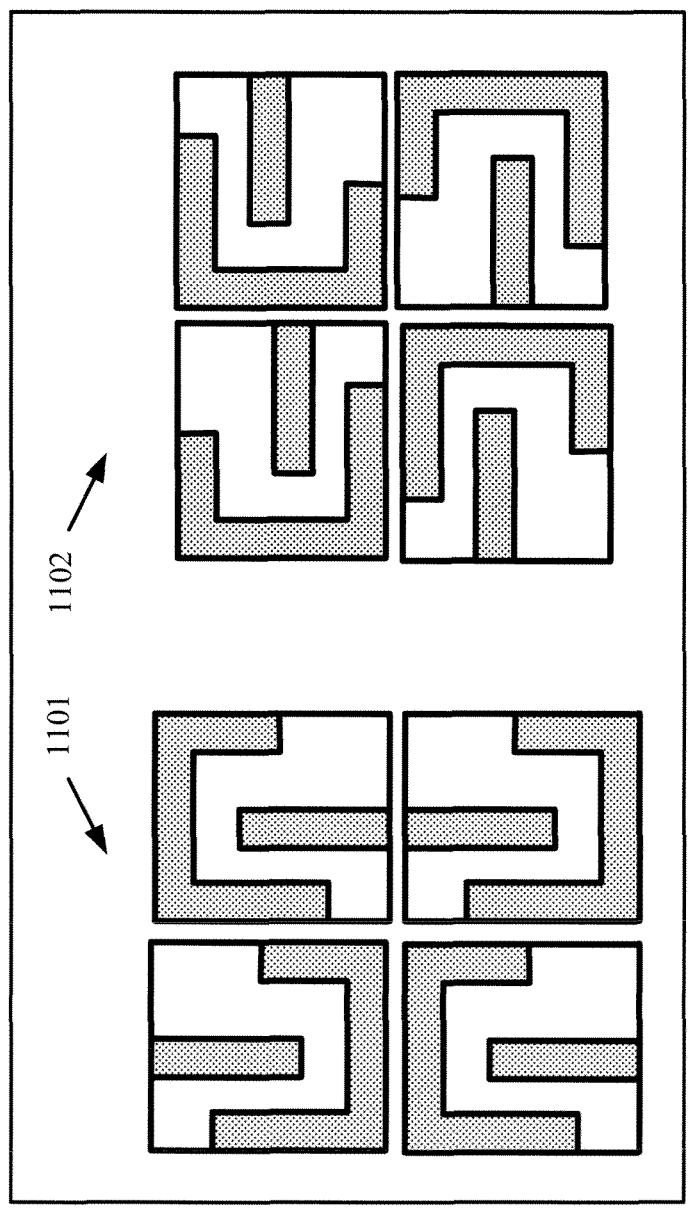
FIG. 11 illustrates the 8 possible orientations for an exemplary pattern.

A single pattern may have eight possible orientations as shown in FIG. 11. Based on MTCG, the extracted critical rules express vertical and horizontal geometric relationships. The rules extracted from a constraint graph $C_h$ are always perpendicular to rules extracted from a constraint graph $C_v$ (see, e.g. FIG. 3, MTCGs 305). Consequently, these eight orientations can be divided into two sets 1101 and 1102. In one embodiment, a runset file can be generated for each of set 1101 and set 1102. In this case, DRC can be run twice to obtain the locations that hit any generated rule.

Based on the DRC results and a plurality of pattern properties, pre-filtering can be applied to find the potential hotspot locations. Note that each extracted critical rule (wherein an "extracted" critical rule refers to applying at least one of the primary or secondary rules described above to a tile and determining its dimensions) is assumed to correspond to be a rectangle. In this manner, DRC can report the locations and dimensions of all polygons or spaces (comprised of block tiles or space tiles, respectively) in the layout that match some specified critical rule.

Figure 12B:
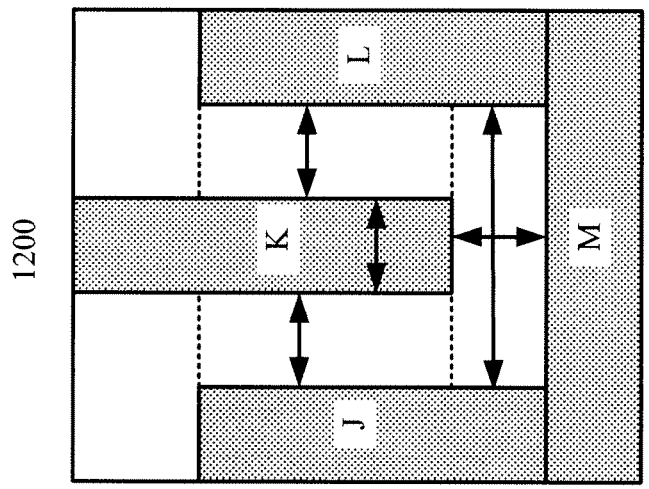
FIGS. 12A, 12B, 12D, and 12E illustrate creating rule rectangles for a pattern.
Figure 12A:
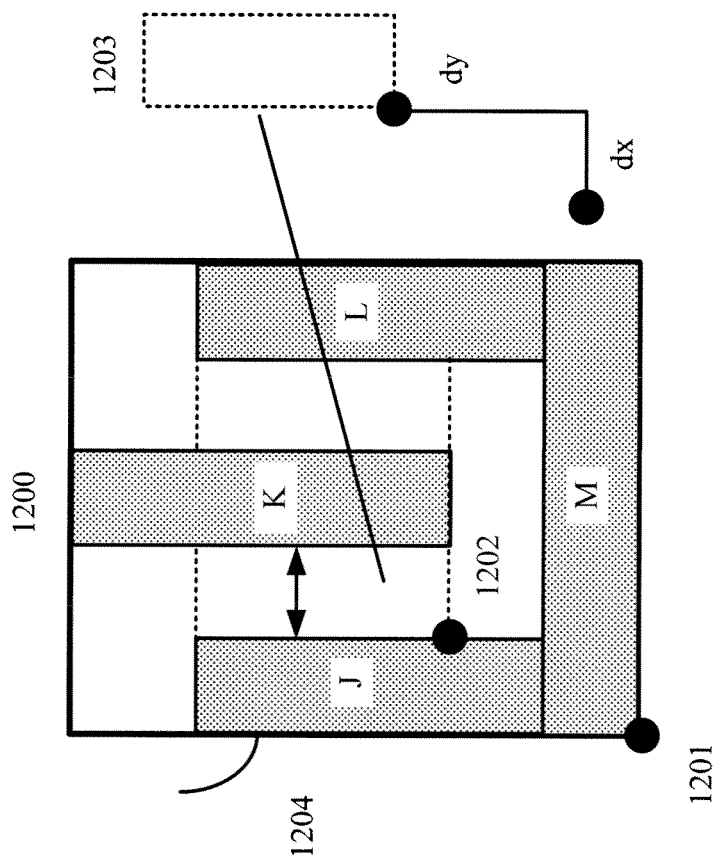

Pre-filtering includes creating one or more rule rectangles for a pattern. To create a rule rectangle, a reference point can be set to a pre-determined corner of a pattern. For example, FIG. 12A shows a pattern 1200 and an exemplary reference point 1201. In this embodiment, a bottom-left corner of a pattern window 1204 has been chosen, although other embodiments can use different corners. For ease of processing, the reference points for all pattern windows should be positioned in the same corner (noting also that all pattern windows have the same size and shape).

Figure 12D:
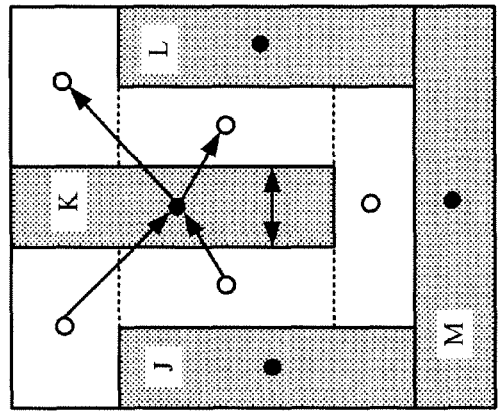
Figure 12E:
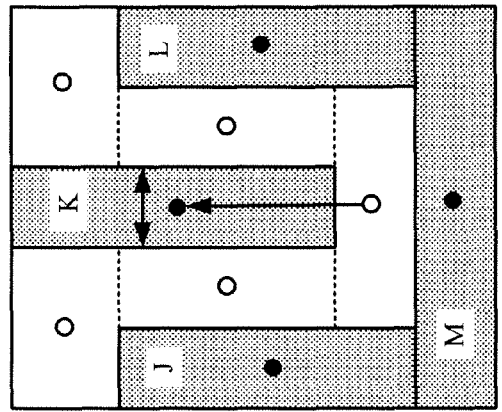
Figure 12C:
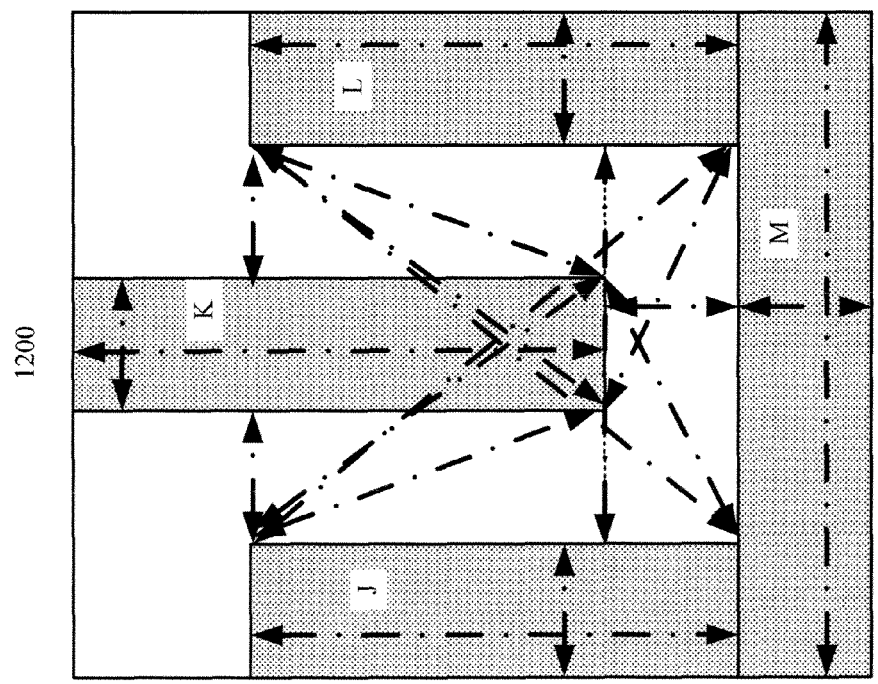
FIG. 12C illustrates typical distance measurements that are extracted by conventional TCG to describe a pattern.

Notably, each extracted rule can be modeled as a rule rectangle. A rule rectangle is associated with a width, a height, and a relative distance $(d_x, d_y)$ between the reference point and the bottom-left corner (i.e. the same corner designated for the reference point in a pattern window) of the rule rectangle. Referring to FIG. 12A, the spacing between polygons J and K is extracted based on the second rule (space tile between block tiles and not touching a window boundary) and is recorded by a rule rectangle 1203, which is provided to the finalization stage (described below). FIG. 12B shows a total of five rule rectangles that are recorded for pattern 1200 (rule rectangles indicated by solid double arrows, each rule rectangle having a width, a height, and a relative distance, as shown (thus, double arrows in FIG. 12B do not indicate merely width or height). In contrast, FIG. 12C shows the distance measurements (shown as dash-dot double arrows) that are extracted by conventional TCG to describe pattern 1200. Note that each polygon may not correspond to one rule rectangle. Indeed, only polygons satisfying the critical rules are extracted. For example, FIGS. 12D and 12E illustrate that polygon K does not have zero in-degree and out-degree connected to space vertices in $C_h$, but does have a zero out-degree in $C_v$. Therefore, polygon K does satisfy the fourth rule wherein the block tile has one edge touching the window boundary.

Pre-filtering indicates the potential hotspot locations for a given pattern by analyzing the DRC results and the rule rectangles generated by critical DRC rule extraction. To facilitate the pre-filtering, a variable hit[x][y] can be used to record the total number of critical DRC rules matched at coordinate (x, y). A queue Q can be used to store all hit[x][y] values (for example, see queue 204A, FIG. 2).

When parsing the DRC results, for each DRC rectangle (i.e. the processing window used by the DRC tool), the corresponding reference point (x', y') in the layout can be calculated according to the $(d_x, d_y)$ set by the rule rectangle, and its hit[x'][y'] value can be incremented by 1. Once the hit value in queue Q is equal to or greater than the number of rule rectangles, a potential hotspot location is identified.

Figure 13:
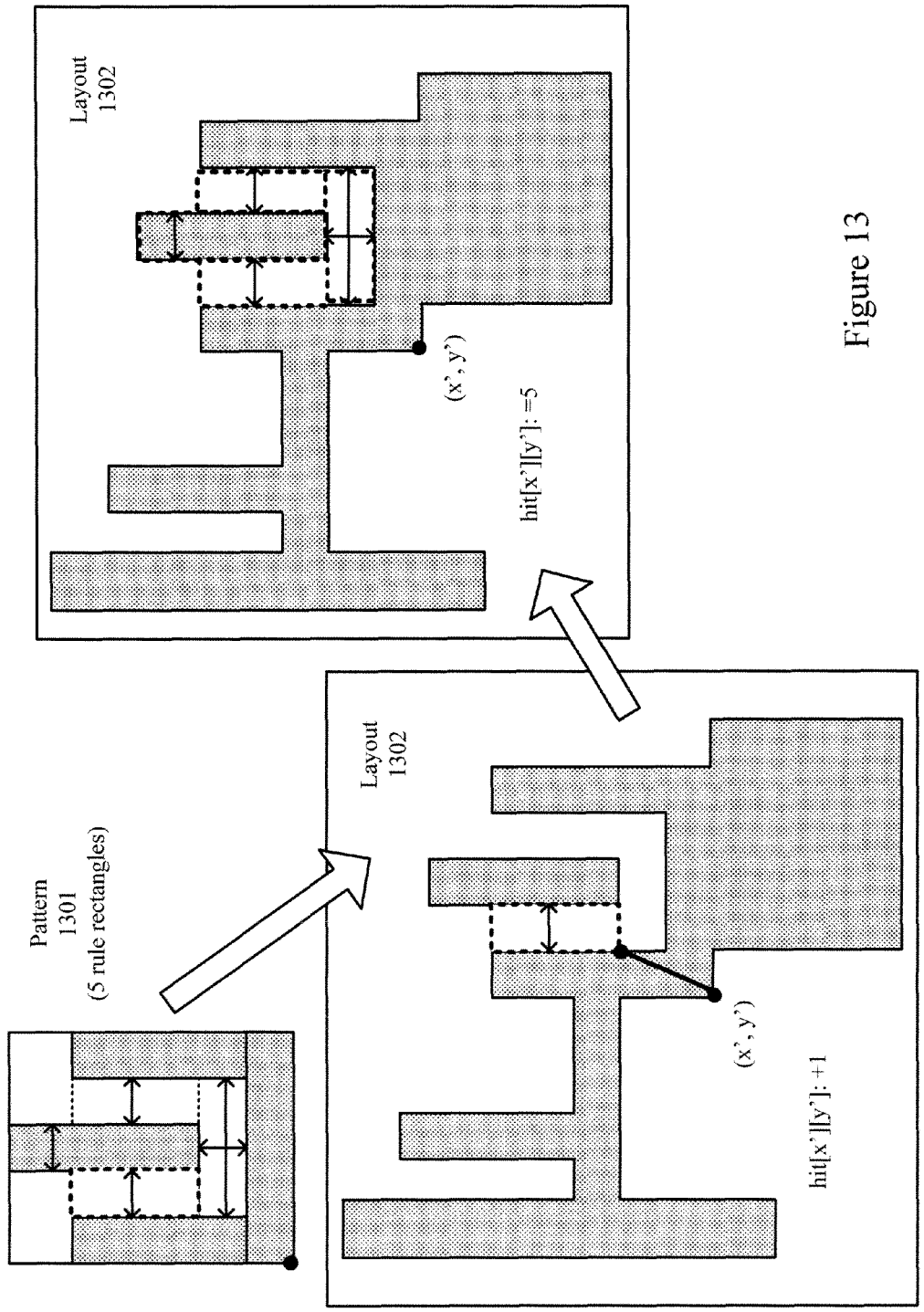
FIG. 13 illustrates a pre-filtering process for an exemplary portion of a layout, the pre-filtering identifying potential hotspots of the layout.

For example, FIG. 13 shows a pattern 1301 having 5 rule rectangles (as generated by critical DRC rule extraction). After pre-filtering is initiated, one rule is identified in a layout 1302. Therefore, hit[x'][y'] is incremented by 1 (+1). As pre-filtering progresses, five matched rules are eventually recorded at (x', y'). Therefore, the location (x', y') is indicated in layout 1302 as a potential hotspot location. Note that layout 1302 is typically part of a much larger layout (not shown). Thus, layout 1302 can be a DRC rectangle of this larger layout.

Figure 14A:
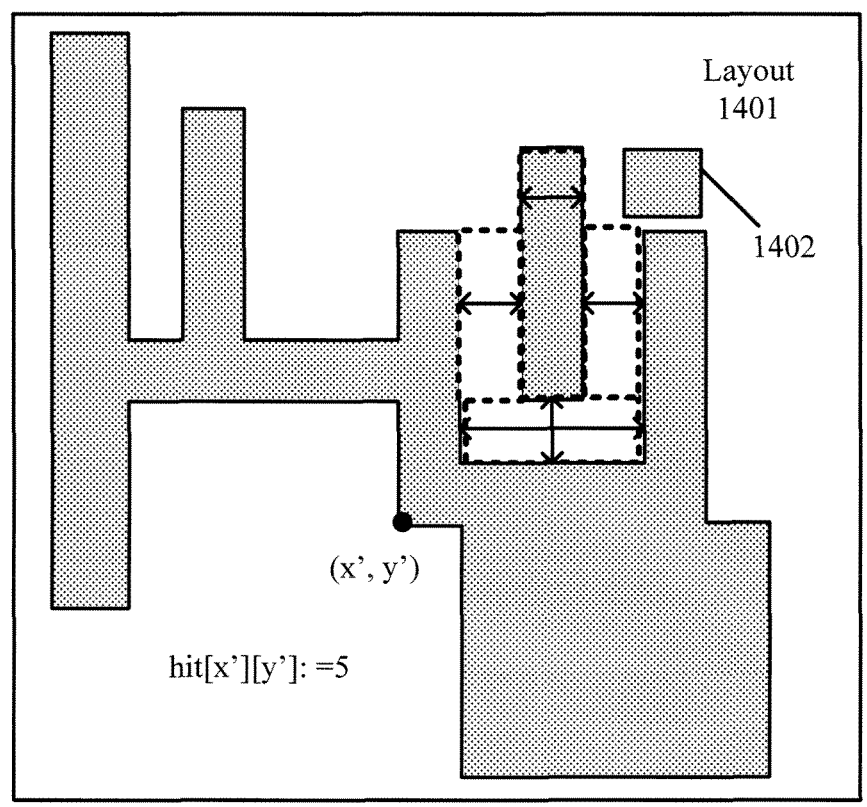
FIGS. 14A, 14B, 14C, and 14D illustrate an exemplary finalization process to verify that potential hotspots are actual hotspots.

Pre-filtering indicates the locations in the layout that match the extracted critical rules. However, some non-hotspot locations might pass pre-filtering. For example, referring to FIG. 14A, location (x', y') in a layout 1401 is reported by pre-filtering because its corresponding hit[x'][y']=5. However, there exists an extra polygon 1402, e.g. compared to pattern 1410 shown in FIG. 14B, and thus (x', y') should be excluded.

Figure 14D:
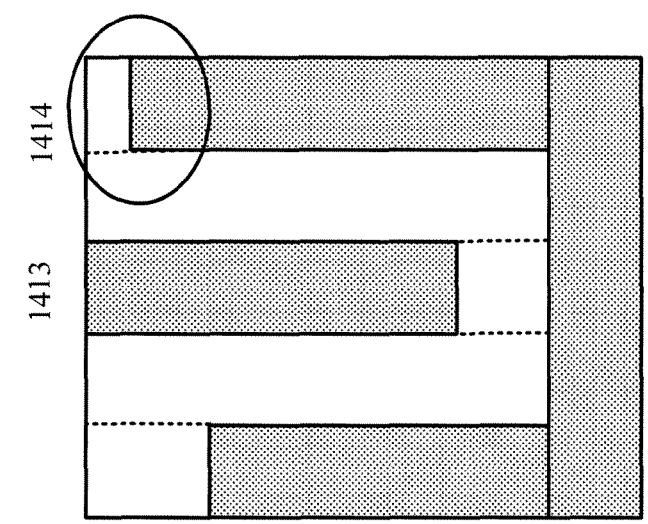
Figure 14C:
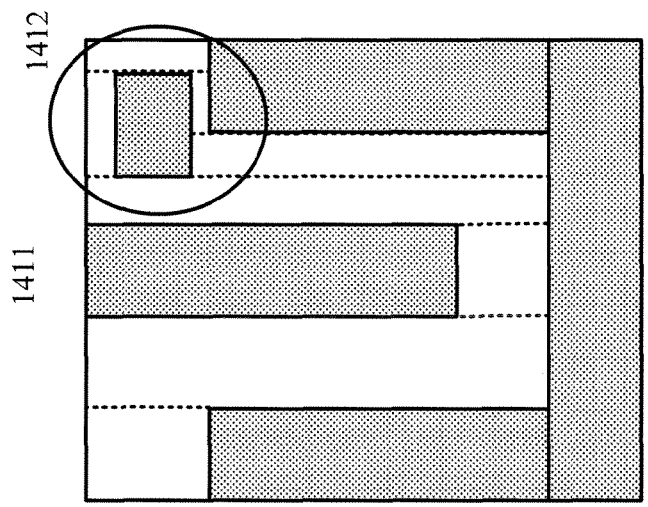
Figure 14B:
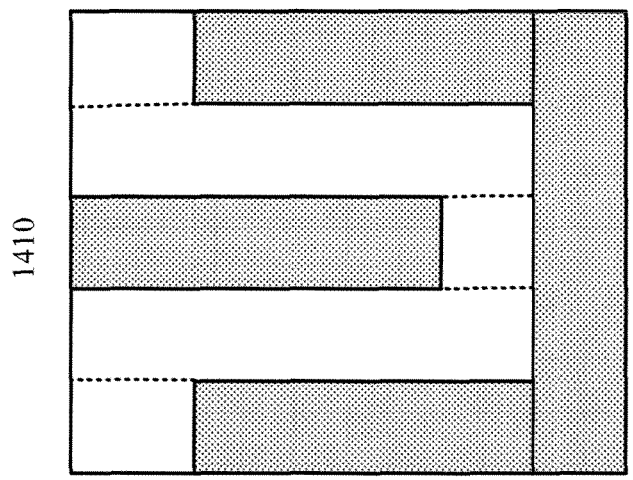

Finalization can be used to verify hotspot locations by analyzing the potential hotspots identified by pre-filtering. FIGS. 14C and 14D illustrate two techniques that can be used during finalization. Referring to FIG. 14C, the potential hotspot identified by pre-filtering can be sliced for tiles. The slicing direction, i.e. vertical or horizontal, should be consistent with that of the MTCG. In the case of the MTCG corresponding to pattern 1410, the slicing direction is vertical. Therefore, as shown in FIG. 14C, the slicing of a potential hotspot 1411 should be vertical. If the number of generated slices for pattern 1410 and potential hotspot 1411 is different, as indicated by area 1412, then potential hotspot 1411 is actually not a hotspot. In one embodiment, the slice comparison technique can be performed using both vertical and horizontal slices of the potential hotspot, thereby ensuring a more complete analysis.

Referring to FIG. 14D, the area covered by polygons in the potential hotspot identified by pre-filtering can be compared to the area covered by polygons in the MTCG. For example, the total area covered by polygons in potential hotspot 1413 can be compared to that of the MTCG corresponding to pattern 1410. An area 1414 of potential hotspot 1413 has more area than the corresponding area of pattern 1410. Therefore, potential hotspot 1413 is actually not a hotspot. In one embodiment, both slice and area comparisons can be performed during finalization.

The above-described process hotspot detection technique provides both accurate and fast results. Unlike existing DRC-based approaches, only critical design rules are extracted to express the topological features of hotspot patterns. A two-stage filtering process can be used to locate all hotspots accurately and efficiently.

The above-described process hotspot detection technique can be implemented in one or more computer programs that execute on a programmable system including at least one programmable processor coupled to receive data and instructions from, and to transmit data and instructions to, a data storage system, at least one input device, and at least one output device. Each computer program can be implemented in a high-level procedural or object-oriented programming language, or in assembly or machine language if desired; and in any case, the language can be a compiled or interpreted language. Suitable processors include, by way of example, both general and special purpose microprocessors, as well as other types of micro-controllers. Generally, a processor will receive instructions and data from a read-only memory and/or a random access memory. Generally, a computer will include one or more mass storage devices for storing data files; such devices include magnetic disks, such as internal hard disks and removable disks, magneto-optical disks, and optical disks. Storage devices suitable for tangibly embodying computer program instructions and data include all forms of non-volatile memory, including by way of example semiconductor memory devices, such as EPROM, EEPROM, and flash memory devices, magnetic disks such as internal hard disks and removable disks, magneto-optical disks, and CDROM disks. Any of the foregoing can be supplemented by, or incorporated in, application-specific integrated circuits (ASICs).

Figure 15:
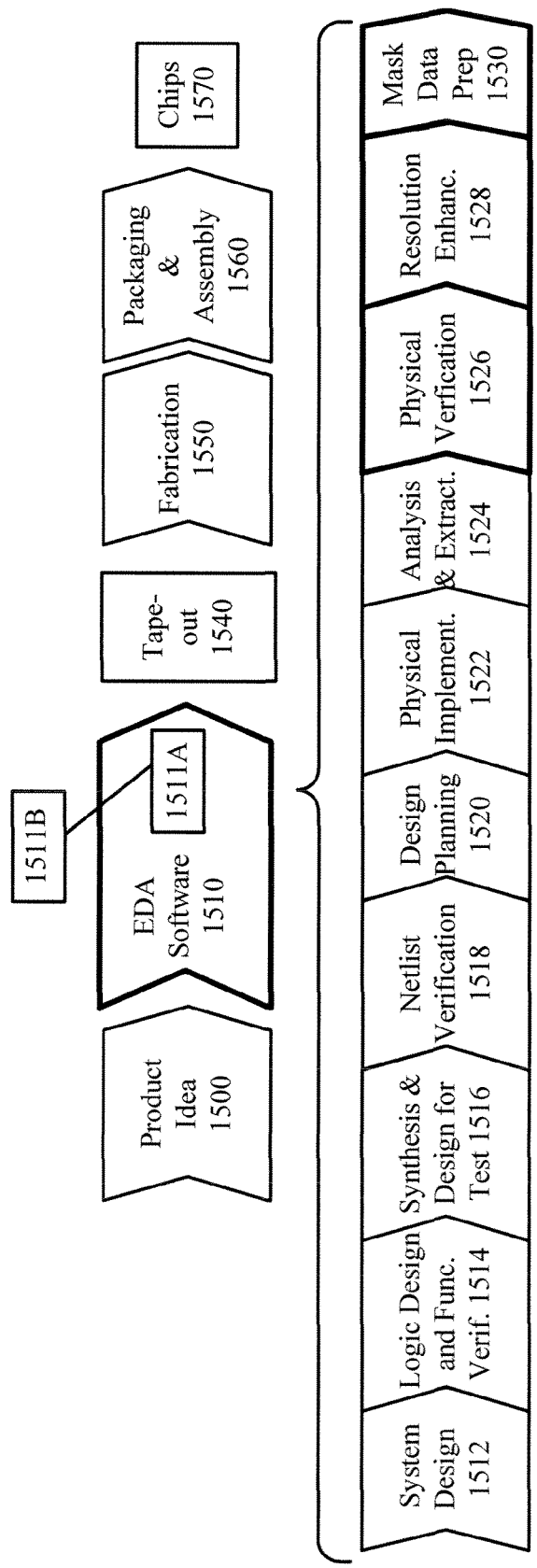
FIG. 15 shows a simplified representation of an exemplary digital ASIC design flow including the accurate process hotspot detection technique described above.

FIG. 15 shows a simplified representation of an exemplary digital ASIC design flow including the accurate process hotspot detection technique described above. At a high level, the process starts with the product idea (step 1500) and is realized in an EDA software design process (step 1510). When the design is finalized, it can be taped-out (event 1540). After tape out, the fabrication process (step 1550) and packaging and assembly processes (step 1560) occur resulting, ultimately, in finished chips (result 1570).

The EDA software design process (step 1510) is actually composed of a number of steps 1512-1530, shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC.

A brief description of the components/steps of the EDA software design process (step 1510) will now be provided. In one embodiment, one or more steps of the EDA software design process can be implemented using a computer-readable medium 1511A, which is read by a computer 1511B. Note that Astro, AstroRail, CustomSim, ESP, Hercules, IC Compiler, Magellan, Model Architect, Power Compiler, PrimeRail, Proteus, ProteusAF, PSMGen, Saber, StarRC, and System Studio are trademarks of Synopsys, Inc., and CATS, DesignWare, Design Compiler, Formality, HSIM, Leda, NanoSim, Primetime, Syndicated, TetraMAX, VCS, and Vera are registered trademarks of Synopsys, Inc. System design (step 1512): The designers describe the functionality that they want to implement, they can perform what-if planning to refine functionality, check costs, etc. Hardware-software architecture partitioning can occur at this stage. Exemplary EDA software products from Synopsys, Inc. that can be used at this step include Model Architect™, Saber™, System Studio™, and DesignWare® products.

Logic design and functional verification (step 1514): At this stage, the VHDL or Verilog code for modules in the system is written and the design is checked for functional accuracy. More specifically, does the design as checked to ensure that produces the correct outputs. Exemplary EDA software products from Synopsys, Inc. that can be used at this step include HSIM®, NanoSim®, CustomSim™, VCS®, VERA®, Designware®, Magellan™, Formality®, ESP™ and LEDA® products.

Synthesis and design for test (step 1516): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this step include Design Compiler®, Power Compiler™, Tetramax®, and DesignWare® products.

Netlist verification (step 1518): At this step, the netlist is checked for compliance with timing constraints and for correspondence with the VHDL/Verilog source code. Exemplary EDA software products from Synopsys, Inc. that can be used at this step include Formality®, PrimeTime™, and VCS® products.

Design planning (step 1520): Here, an overall floorplan for the chip is constructed and analyzed for timing and top-level routing. Exemplary EDA software products from Synopsys, Inc. that can be used at this step include Astro™ and IC Compiler™ products.

Physical implementation (step 1522): The placement (positioning of circuit elements) and routing (connection of the same) occurs at this step. Exemplary EDA software products from Synopsys, Inc. that can be used at this step include the Astro™ and IC Compiler™ products.

Analysis and extraction (step 1524): At this step, the circuit function is verified at a transistor level, this in turn permits what-if refinement. Exemplary EDA software products from Synopsys, Inc. that can be used at this step include AstroRail™, PrimeRail™, Primetime®, and Star RC/XT™ products.

Physical verification (step 1526): At this step various checking functions are performed to ensure correctness for: manufacturing, electrical issues, lithographic issues, and circuitry. Exemplary EDA software products from Synopsys, Inc. that can be used at this step include the Hercules™ product. In one embodiment, the process hotspot detection technique using critical design rule extraction can be used in step 1526.

Resolution enhancement (step 1528): This step involves geometric manipulations of the layout to improve manufacturability of the design. Exemplary EDA software products from Synopsys, Inc. that can be used at this step include Proteus™, ProteusAF™, and PSMGen™ products. In one embodiment, the process hotspot detection technique using critical design rule extraction can be used in step 1528.

Mask data preparation (step 1530): This step provides the "tape-out" data for production of masks for lithographic use to produce finished chips. Exemplary EDA software products from Synopsys, Inc. that can be used at this step include the CATS® family of products. In one embodiment, the process hotspot detection technique using critical design rule extraction can be used in step 1530.

As indicated above, physical verification step 1526, resolution enhancement step 1528, and mask data preparation step 1530 can benefit from pattern matching. Currently, most pattern matching is done by manually writing DRC rules for each pattern and then searching the entire layout to find occurrences. Advantageously, by using the above-described process hotspot detection technique using critical design rule extraction, pattern matching can be automated, thereby significantly improving turn around time from product idea 1500 to tape-out 1540.

Although illustrative embodiments of the invention have been described in detail herein with reference to the accompanying figures, it is to be understood that the invention is not limited to those precise embodiments. Thus, the scope of the invention is defined by the following claims and their equivalents.

The invention claimed is:

1. A method for providing process hotspot detection, the method comprising:
   extracting critical design rule checking (DRC) rules from a hotspot pattern to generate extracted critical DRC rules and rule rectangles, the extracting including generating two tiled patterns from the hotspot pattern, one tiled pattern being horizontal tiles, and another tiled pattern being vertical tiles, and adding directed edges to indicate relations between adjacent tiles, the rule rectangles describing polygon placement in the hotspot pattern with a minimal number of critical DRC rules;
   including the extracted critical DRC rules in a DRC runset file;
   performing DRC with the DRC runset file on a layout;
   filtering DRC results, generated from the performing, using the rule rectangles to identify potential hotspots and to verify actual hotspots,
   the method being performed by a computer.

2. The method of claim 1, wherein the extracting critical DRC rules includes generating a plurality of modified transitive closure graphs (MTCGs).

3. The method of claim 2, wherein generating the plurality of MTCGs includes using a sweep line algorithm.

4. The method of claim 1, wherein the describing polygon placement includes using 5 or less critical DRC rules.

5. The method of claim 2, wherein a first critical DRC rule measures a width and a height of a block tile only when the block tile does not touch a window boundary of the tiled pattern.

6. The method of claim 5, wherein a second critical DRC rule determines a distance between two adjacent block tiles by measuring a width and a height of a space tile that does not touch the window boundary of the tiled pattern and is located between two block tiles.

7. The method of claim 6, wherein a third critical DRC rule measures a distance between two convex corners formed by block tiles.

8. The method of claim 7, wherein a fourth critical DRC rule includes identifying a space tile or a block tile having a single edge touching the window boundary.

9. The method of claim 8, wherein a fifth critical DRC rule includes identifying a space tile having exactly two edges touching the window boundary.

10. The method of claim 2, wherein the extracting critical DRC rules includes using 8 possible orientations for the hotspot pattern.

11. The method of claim 2, wherein the filtering includes recording a total number of rule rectangles associated with a given location on the layout, and comparing the total number to a number of rule rectangles of the tiled pattern, wherein when the total number is equal to or greater than the number of rule rectangles of the tiled pattern, then identifying a potential hotspot.

12. The method of claim 11, wherein the filtering further includes performing at least one of slice comparisons and area comparisons to verify that the potential hotspot is an actual hotspot.

13. A non-transitory, computer-readable medium storing computer-executable instructions for providing hotspot detection, the instructions when executed by a processor cause the processor to execute a process comprising:
    extracting critical design rule checking (DRC) rules from a hotspot pattern to generate extracted critical DRC rules and rule rectangles, the extracting including generating two tiled patterns from the hotspot pattern, one tiled pattern being horizontal tiles, and another tiled pattern being vertical tiles, and adding directed edges to indicate relations between adjacent tiles, the rule rectangles describing polygon placement in the hotspot pattern with a minimal number of critical DRC rules;
    including the extracted critical DRC rules in a DRC runset file;
    performing DRC with the DRC runset file on a layout;
    filtering DRC results, generated from the performing, using the rule rectangles to identify potential hotspots and to verify actual hotspots.

14. The computer-readable medium of claim 13, wherein the extracting critical DRC rules includes generating a plurality of modified transitive closure graphs (MTCGs).

15. The computer-readable medium of claim 14, wherein generating the plurality of MTCGs includes using a sweep line algorithm.

16. The computer-readable medium of claim 13, wherein the describing polygon placement includes using 5 or less critical DRC rules.

17. The computer-readable medium of claim 14, wherein a first critical DRC rule measures a width and a height of a block tile only when the block tile does not touch a window boundary of the tiled pattern.

18. The computer-readable medium of claim 17, wherein a second critical DRC rule determines a distance between two adjacent block tiles by measuring a width and a height of a space tile that does not touch the window boundary of the tiled pattern and is located between two block tiles.

19. The computer-readable medium of claim 18, wherein a third critical DRC rule measures a distance between two convex corners formed by block tiles.

20. The computer-readable medium of claim 19, wherein a fourth critical DRC rule includes identifying a space tile or a block tile having a single edge touching the window boundary.

21. The computer-readable medium of claim 20, wherein a fifth critical DRC rule includes indentifying a space tile having exactly two edges touching the window boundary.

22. The computer-readable medium of claim 14, wherein the extracting critical DRC rules includes using 8 possible orientations for the hotspot pattern.

23. The computer-readable medium of claim 14, wherein the filtering includes recording a total number of rule rectangles associated with a given location on the layout, and comparing the total number to a number of rule rectangles of the tiled pattern, wherein when the total number is equal to or greater than the number of rule rectangles of the tiled pattern, then identifying a potential hotspot.

24. The computer-readable medium of claim 23, wherein the filtering further includes performing at least one of slice comparisons and area comparisons to verify that the potential hotspot is an actual hotspot.

25. A system comprising:
    a processor configured to execute a process comprising:
       extracting critical design rule checking (DRC) rules from a hotspot pattern to generate extracted critical DRC rules and rule rectangles, the extracting including generating two tiled patterns from the hotspot pattern, one tiled pattern being horizontal tiles, and another tiled pattern being vertical tiles, and adding directed edges to indicate relations between adjacent tiles, the rule rectangles describing polygon placement in the hotspot pattern with a minimal number of critical DRC rules;

including the extracted critical DRC rules in a DRC runset file;

performing DRC with the DRC runset file on a layout;

filtering DRC results, generated from the performing, using the rule rectangles to identify potential hotspots and to verify actual hotspots; and an output device for generating matched locations indicating verified actual hotspots in the layout.

26. The system of claim 25, wherein the extracting critical DRC rules includes generating a plurality of modified transitive closure graphs (MTCGs).

27. The system of claim 26, wherein generating the plurality of MTCGs includes using a sweep line algorithm.

28. The system of claim 25, wherein the describing polygon placement includes using 5 or less critical DRC rules.

29. The system of claim 26, wherein a first critical DRC rule measures a width and a height of a block tile only when the block tile does not touch a window boundary of the tiled pattern.

30. The system of claim 29, wherein a second critical DRC rule determines a distance between two adjacent block tiles by measuring a width and a height of a space tile that does not touch the window boundary of the tiled pattern and is located between two block tiles.

31. The system of claim 30, wherein a third critical DRC rule measures a distance between two convex corners formed by block tiles.

32. The system of claim 31, wherein a fourth critical DRC rule includes identifying a space tile or a block tile having a single edge touching the window boundary.

33. The system of claim 32, wherein a fifth critical DRC rule includes indentifying a space tile having exactly two edges touching the window boundary.

34. The system of claim 25, wherein the extracting critical DRC rules includes using 8 possible orientations for the hotspot pattern.

35. The system of claim 26, wherein the filtering includes recording a total number of rule rectangles associated with a given location on the layout, and comparing the total number to a number of rule rectangles of the tiled pattern, wherein when the total number is equal to or greater than the number of rule rectangles of the tiled pattern, then identifying a potential hotspot.

36. The system of claim 35, wherein the filtering further includes performing at least one of slice comparisons and area comparisons to verify that the potential hotspot is an actual hotspot.

* * * * *